(12) United States Patent
Choo et al.

(10) Patent No.: US 9,711,583 B2
(45) Date of Patent: Jul. 18, 2017

(54) DISPLAY DEVICE

(71) Applicant: LG DISPLAY CO., LTD., Seoul (KR)

(72) Inventors: Kyoseop Choo, Suwon-si (KR);
Jonguk Bae, Seoul (KR); Bokyoung Cho, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 14 days.

(21) Appl. No.: 14/558,434

(22) Filed: Dec. 2, 2014

(65) Prior Publication Data

US 2016/0020264 A1 Jan. 21, 2016

(30) Foreign Application Priority Data

Jul. 17, 2014 (KR) ........................ 10-2014-0090575

(51) Int. Cl.
*H01L 27/32* (2006.01)
*H01L 29/786* (2006.01)

(52) U.S. Cl.
CPC ...... *H01L 27/3272* (2013.01); *H01L 29/7869* (2013.01)

(58) Field of Classification Search
CPC ................................................ H01L 27/3272
See application file for complete search history.

(56) References Cited

U.S. PATENT DOCUMENTS

| | | | | |
|---|---|---|---|---|
| 8,120,017 | B2* | 2/2012 | Lee | H01L 27/3276 257/40 |
| 9,065,073 | B2* | 6/2015 | Choi | H01L 51/5253 |
| 9,136,315 | B1* | 9/2015 | Kim | H01L 27/3276 |
| 2002/0037600 | A1* | 3/2002 | Hirabayashi | H01L 31/02164 438/30 |
| 2005/0110023 | A1* | 5/2005 | Lee | H01L 27/3276 257/72 |
| 2007/0035225 | A1* | 2/2007 | Lee | H01L 51/5281 313/111 |
| 2007/0090365 | A1 | 4/2007 | Hayashi et al. | |
| 2009/0045733 | A1* | 2/2009 | Suh | H01L 27/3276 313/504 |
| 2009/0206737 | A1* | 8/2009 | Liu | H01L 27/1214 313/504 |
| 2011/0109596 | A1* | 5/2011 | Yoon | H01L 27/3272 345/204 |
| 2011/0175082 | A1* | 7/2011 | Kim | H01L 27/1225 257/43 |
| 2011/0221989 | A1* | 9/2011 | Lee | G02F 1/134309 349/41 |
| 2012/0098811 | A1* | 4/2012 | Park | G02F 1/136286 345/211 |
| 2012/0183721 | A1 | 7/2012 | Niiyama et al. | |

(Continued)

FOREIGN PATENT DOCUMENTS

TW 201312758 A1 3/2013

*Primary Examiner* — Caridad Everhart
*Assistant Examiner* — Ankush Singal
(74) *Attorney, Agent, or Firm* — Birch, Stewart, Kolasch & Birch, LLP

(57) ABSTRACT

Discussed is a display device, that may include a substrate divided into a display area and a non-display area except the display area, a first light shielding film formed in the display area, a second light shielding film formed in the non-display area, and oxide thin film transistors and organic light emitting diodes, which are formed on the first light shielding film, wherein the first light shielding film and the second light shielding film are spaced apart from each other.

15 Claims, 9 Drawing Sheets

(56) References Cited

U.S. PATENT DOCUMENTS

| | | | |
|---|---|---|---|
| 2012/0229736 A1 | 9/2012 | Osaki et al. | |
| 2013/0001564 A1* | 1/2013 | Choi | H01L 27/3276 |
| | | | 257/59 |
| 2013/0048991 A1 | 2/2013 | Nakadaira | |
| 2013/0105804 A1* | 5/2013 | Jung | G02F 1/1339 |
| | | | 257/59 |
| 2013/0229591 A1* | 9/2013 | Kong | G02F 1/136209 |
| | | | 349/46 |
| 2014/0145155 A1* | 5/2014 | Park | H01L 27/3244 |
| | | | 257/40 |
| 2014/0175394 A1* | 6/2014 | Kum | H01L 51/5246 |
| | | | 257/40 |
| 2014/0291669 A1* | 10/2014 | Ji | H01L 29/66969 |
| | | | 257/43 |
| 2015/0001482 A1* | 1/2015 | Jung | H01L 27/323 |
| | | | 257/40 |
| 2015/0102336 A1* | 4/2015 | Kang | H01L 27/1225 |
| | | | 257/43 |
| 2015/0115229 A1* | 4/2015 | Jung | H01L 51/0097 |
| | | | 257/40 |
| 2015/0116295 A1* | 4/2015 | Pyon | H01L 51/5203 |
| | | | 345/211 |
| 2015/0123081 A1* | 5/2015 | Huang | H01L 27/3279 |
| | | | 257/40 |
| 2015/0179708 A1* | 6/2015 | Jeon | H01L 27/326 |
| | | | 257/40 |
| 2015/0187959 A1* | 7/2015 | Yoon | H01L 27/1225 |
| | | | 257/43 |
| 2015/0263308 A1* | 9/2015 | Park | H01L 51/529 |
| | | | 257/40 |

* cited by examiner

DISPLAY DEVICE

This application claims the priority benefit of Korean Patent Application No. 10-2014-0090575 filed on Jul. 17, 2014, which is hereby incorporated by reference for all purposes as if fully set forth herein.

BACKGROUND OF THE INVENTION

Field of the Invention

The present invention relates to a display device, and more particularly, to a display device capable of having improved reliability by preventing the inflow of static electricity generated at the time of a scribing process.

Discussion of the Related Art

Recently, flat panel displays (FPDs) are becoming increasingly important with the development of multimedia. Accordingly, several display devices such as a liquid crystal display (LCD), a plasma display panel (PDP), a field emission display (FED), and an organic light emitting device (OLED) are used. Of theses, the organic light emitting display is being considered as a next-generation display device since the organic light emitting display has exhibits a high-speed response of 1 ms or less and low power consumption, and has self-light emission characteristics, causing no problems in the viewing angle.

The display device is driven in a passive matrix manner and an active matrix manner using thin film transistors. While the driving is implemented by forming positive electrodes and negative electrodes to cross each other and selecting a line according to the passive matrix manner, the driving is implemented by respectively connecting thin film transistors to pixels and maintaining a voltage through the capacitance of capacitors connected to gate electrodes of the thin film transistors.

Durability capable of keeping the lifespan and electric reliability as well as basic features of the thin film transistor, such as mobility and leakage current, are important for the thin film transistors. Here, an active layer of the thin film transistors is mainly formed of amorphous silicon or poly silicon. Amorphous silicon has advantages in that a film forming process is simple and the production cost is low, but a disadvantage in that electric reliability cannot be secured. In addition, poly silicon has disadvantages in that it is very difficult to implement a large-area application due to a high process temperature and the uniformity according to the crystallizing manner cannot be secured.

Meanwhile, in the case where the active layer is formed of an oxide, high mobility can be obtained even though the film is formed at a low temperature, and desired physical properties can be easily obtained since the change in resistance is large depending on the content of oxygen. Thus, the oxide is recently receiving a great attention in the application to the thin film transistor. Particularly, an example of the oxide usable in the active layer may be zinc oxide (ZnO), indium zinc oxide (InZnO), indium gallium zinc oxide (InGaZnO$_4$), or the like. The thin film transistor including an active layer of oxide is unstable since the photocurrent is generated by an external light source, and thus a light shielding film for shielding the active layer from the external light is needed.

FIG. 1 is a plane view of a display device according to a related art; and FIG. 2 is a cross-sectional view cut along line IT of FIG. 1.

Referring to FIG. 1, a display device according to the art includes a plurality of display panels DP in which a plurality of active areas A/A are formed on a substrate 10 as a mother substrate. A scribing process is performed to separate respective independent panels from the formed display panels DP. According to the scribing process, the independent display panels DP are prepared by cutting the substrate 10 along scribing line ① and then cutting the substrate 10 along scribing line ② using a scribing wheel.

More specifically, referring to FIG. 2, a light shielding layer LS is disposed on the substrate 10, and a buffer layer 15 is disposed on the light shielding layer LS. The light shielding layer LS prevents the light from entering an active layer to be later formed. An active layer 20 is formed on the buffer layer 15, and insulated by a gate insulating film 25 disposed on the active layer 20. A gate electrode 30 is formed on the gate insulating film 25, and insulated by an interlayer film 35. A source electrode 40a and a drain electrode 40b are formed on the interlayer insulating film 35, and connected to the active layer 20 through contact holes 35a and 35b, thereby configuring a thin film transistor TFT. An organic insulating film 45 is disposed on the thin film transistor TFT. A pixel electrode 50 is disposed on the organic insulating film 45, and connected to the drain electrode 40b through a via hole 47. A bank layer 55 is disposed on the pixel electrode 50, and a light emitting layer 60 is disposed on the pixel electrode 50 exposed by the bank layer 55. A counter electrode 65 is disposed above the substrate 20 provided with the light emitting layer 60, and the resultant substrate is sealed with a counter substrate 70, thereby configuring a display device.

Meanwhile, as described above, the active layer 20 formed of an oxide is unstable since the photocurrent is generated by an external light, and thus the light shielding layer LS is formed on the entire surface of the substrate 20. However, during a scribing process, the static electricity generated when the substrate 20 is cut by a scribing wheel penetrates into the active area A/A through the light shielding layer LS, thereby influencing the thin film transistor. Therefore, electric characteristics of the thin film transistor are degraded, causing a deterioration in reliability.

SUMMARY OF THE INVENTION

Accordingly, the present invention provides a display device capable of having improved reliability by preventing the inflow of static electricity generated during a scribing process.

In one aspect, there is a display device comprising a substrate divided into a display area and a non-display area except the display area, a first light shielding film formed in the display area, a second light shielding film formed in the non-display area, and oxide thin film transistors and organic light emitting diodes, which are formed on the first light shielding film, wherein the first light shielding film and the second light shielding film are spaced apart from each other.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 3:
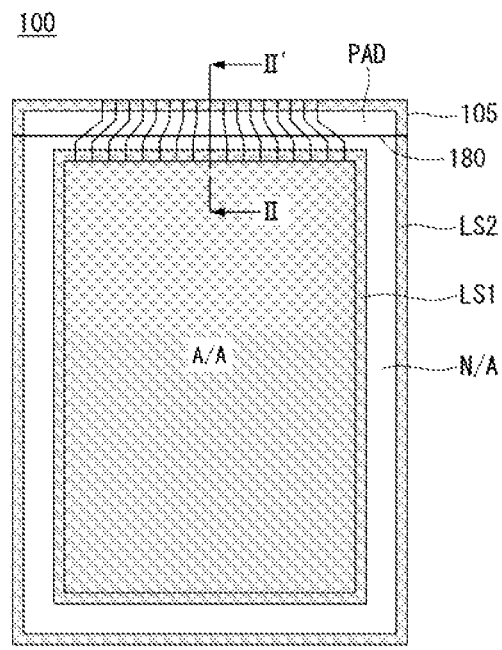
FIG. 3 is a plane view illustrating a display device according to a first embodiment of the present invention.
Figure 4:
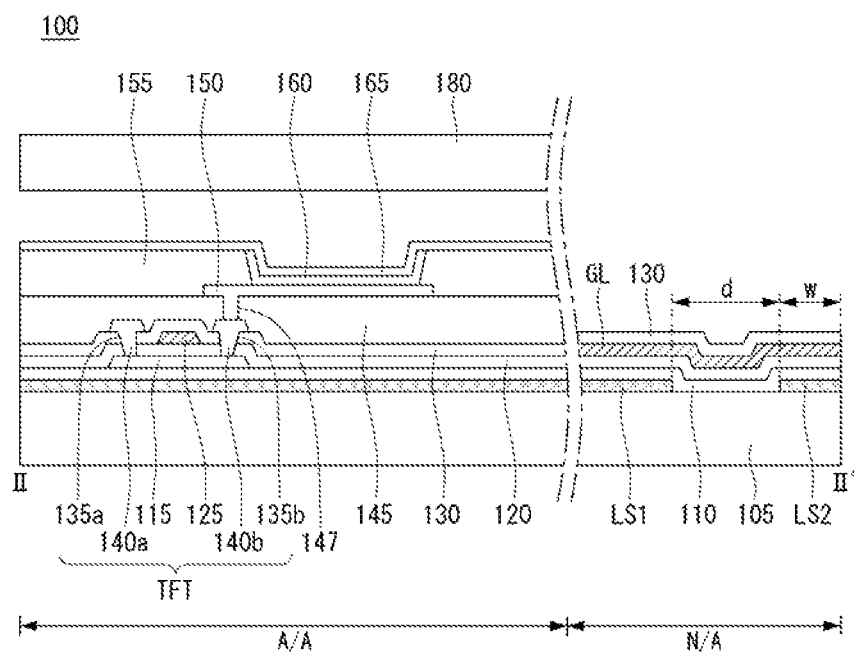
FIG. 4 is a cross-sectional view cut along line II-II' of FIG. 3.

FIG. 3 is a plane view illustrating a display device according to a first embodiment of the present invention; and FIG. 4 is a cross-sectional view cut along line II-II' of FIG. 3. Hereinafter, a display device of the present invention will be described by exemplifying an organic light emitting display. However, the present invention is not limited thereto, and thus the present invention may be applied to a flat display device, such as a liquid crystal display.

Referring to FIG. 3, a display device 100 set forth in the first embodiment of the present invention includes a substrate 105 and a counter substrate 180, which are bound to each other, and includes a display area A/A and a non-display area N/A as the rest area except the display area A/A. The display area A/A is an active area A/A in which a thin film transistor array and organic light emitting diodes are formed to display images, and the non-display area N/A is a non-active region N/A which is the rest area except the active area A/A and does not display images. In order to apply driving signals to the display area A/A, driving chips are mounted and a pad part PAD including a plurality of lines receiving signals from an external printed circuit board is disposed in the non-display area N/A.

Light shielding films LS1 and LS2 for blocking the entrance of an external light are provided in the display area A/A and the non-display area N/A, respectively. The first shielding film LS1 is positioned at least throughout the display area A/A to block light from entering the thin film transistor formed in the display area A/A. The second shielding film LS2 is positioned to surround the edge of the non-display area N/A to block static electricity from being transferred to the display area A/A at the time of a scribing process. Here, the first light shielding film LS1 positioned in the display area A/A and the second light shielding film LS2 positioned in the non-display area are spaced apart from each other, thereby preventing static electricity from being transferred to the display area A/A along the light shielding film, at the time of a scribing process.

More specifically, the first and second light shielding films LS1 and LS2 formed in the display area A/A and the non-display area N/A will be described with reference to FIG. 4. In the following description, a single subpixel is exemplified to describe the display area A/A.

The first light shielding film LS1 is positioned in the display area A/A on the substrate 105, and the second light shielding film LS2 is positioned in the non-display area N/A on the substrate 105. The substrate 105 is formed of glass, plastic, or metal. The first and second light shielding films LS1 and LS2 is for blocking an external light from entering the inside of display panel, and are formed of a material capable of blocking light. The first and second light shielding films LS1 and LS2 are formed of a material having low electric conductivity and low reflectance, and may be formed of, for example, a semiconductor-based material, such as amorphous silicon (a-si) germanium (Ge), tantalum oxide (TaOx), or copper oxide (CuOx).

A buffer layer 110 is disposed over the substrate 105 provided with the first and second light shield films LS1 and LS2. The buffer layer 110 is formed to protect a thin film transistor, which is to be formed in a subsequent process, from impurities, such as alkali ions, flowing out from the substrate 105. The buffer layer 110 is formed of silicon oxide (SiOx), silicon nitride (SiNx), or the like. An active layer 115 is formed on the buffer layer 110. The active layer 115 may be formed of an amorphous zinc oxide-based composite semiconductor. Particularly, in the case of α-IGZO semiconductor, the active layer 115 may be formed by sputtering using a composite target of gallium oxide ($Ga_2O_3$), indium oxide ($In_2O_3$), and zinc oxide (ZnO). Besides, a chemical deposition method, such as chemical vapor deposition or atomic layer deposition (ALD) may be employed. Here, in the embodiment of the present invention, an amorphous zinc oxide-based composite semiconductor may be deposited using a composite oxide target containing gallium, indium, and zinc at an atomic ratio of 1:1:1, 2:2:1, 3:2:1, or 4:2:1. Here, in the case where the composite oxide target containing gallium, indium, and zinc at an atomic ratio of 2:2:1, the equivalent weight ratio of gallium, indium, and zinc may be 2.8:2.8:1. Although not shown, a source region and a drain region are provided at both sides of the active layer 115 by doping impurities, and a channel region is provided between the source region and the drain region.

A gate insulating film 200 is disposed on the active layer 115. The gate insulating film 120 is formed of a silicon oxide film (SiOx), a silicon nitride film (SiNx), or a multilayer thereof. On the gate insulating film 120, a gate electrode 125 is disposed in the display area A/A, and a gate line GL connected to the gate electrode 125 is disposed in the non-display area N/A. The gate electrode 125 is formed of any one selected from the group consisting of copper (Cu), molybdenum (Mo), aluminum (Al), chromium (Cr), gold (Au), titanium (Ti), nickel (Ni), neodymium (Nd), tantalum (Ta), and tungsten (W), or a single layer or a multilayer of an alloy thereof The gate electrode 125 is disposed to correspond to the channel region of the active layer 115.

An interlayer insulating film 130 is disposed over the substrate 105 provided with the gate electrode 125. The interlayer insulating film 130 is formed of a silicon oxide film (SiOx), a silicon nitride film (SiNx), or a multilayer thereof In addition, contact holes 135a and 135b exposing the source region and the drain region at both sides of the active layer 115 are provided in the interlayer insulating film 130 and the gate insulating film 120.

A source electrode 140a and a drain electrode 140b are disposed on the interlayer insulating film 130. The source electrode 140a and the drain electrode 140b may be formed as a single layer or a multilayer. In the case where the source electrode 140a and the drain electrode 140b are formed as a single layer, the electrodes may be formed of any one selected from molybdenum (Mo), aluminum (Al), chromium (Cr), gold (Au), titanium (Ti), nickel (Ni), and copper (Cu), or an alloy thereof Alternatively, in the case where the source electrode 140a and the drain electrode 140b are formed as a multilayer, the electrodes may be formed of a double layer of molybdenum/aluminum-neodymium, molybdenum/aluminum, or titanium/aluminum or a triple layer of molybdenum/aluminum-neodymium/molybdenum, molybdenum/aluminum/molybdenum, or titanium/aluminum/titanium. The source electrode 140a and the drain electrode 140b are respectively connected to the source region and the drain region of the active layer 120 through contact holes 135a and 135b formed in the interlayer insulating film 130 and the gate insulating film 120.

An organic insulating film 145 is disposed over the substrate 105 provided with the source electrode 140a and the drain electrode 140b. The organic insulating film 145 may be formed of an organic material, such as photo acryl, polyimide, benzocyclobutene resin, and acrylate. A via hole 147 exposing the drain electrode 140b of the thin film transistor TFT is formed in the organic insulating film 145.

A pixel electrode 150 is disposed on the organic insulating film 145. The pixel electrode 150 may be formed of a transparent conductive film. The transparent conductive film may be a material having transparency and conductivity, such as indium tin oxide (ITO) or indium zinc oxide (IZO). Here, in the case where an organic light emitting display is manufactured in a top emission type structure, a reflective metal film having a high reflectance, such as aluminum (Al), aluminum-neodymium (Al—Nd), silver (Ag), or a silver alloy, may be formed below the transparent conductive film, and the reflective film may have a structure of a transparent conductive film/a reflective metal film/a transparent conductive film. Preferably, the pixel electrode 150 may have a structure of, for example, ITO/Ag/ITO. The pixel electrode 150 is connected to the drain electrode 140b through the via hole 147 provided in the organic insulating film 145.

A bank layer 155 exposing the pixel electrode 150 is formed on the pixel electrode 150. The bank layer 155 defines pixels and insulates the pixel electrodes 150, and is formed of an organic material, such as polyimide, benzocyclobutene-based resin, or acrylate. An organic light emitting layer 160 is formed on the pixel electrode 150 and the bank layer 155. The organic light emitting layer 160 includes at least an emission layer, and may further include a hole injection layer, a hole transport layer, an electron transport layer, or an electron injection layer. A counter electrode 165 is disposed on the organic light emitting layer 160. The counter electrode 165 may be formed of a metal material having a low work function, such as silver (Ag), magnesium (Mg), or calcium (Ca). Thus, an organic light emitting diode composed of the pixel electrode 150, the organic light emitting layer 160, and the counter electrode 165 is configured. The substrate provided with the thin film transistors and the organic light emitting diodes are sealed through a counter substrate 180, thereby configuring a display device of the present invention.

Meanwhile, the first light shielding film LS1 and the second light shield film LS2 formed above the substrate 105 are respectively positioned in the display area A/A and the non-display area N/A. The first shielding film LS1 is positioned in at least the entire region of the display area A/A to block light from entering the thin film transistor formed in the display area A/A. The second shielding film LS2 is positioned to surround the edge of the non-display area N/A to block from static electricity from being transferred to the display area A/A at the time of a scribing process. The first light shielding film LS1 is formed in a plate shape so as to cover the overall display area A/A, and the second light shielding film LS2 is continuously formed without disconnection so as to surround the overall edge of the substrate 105. The second light shielding film LS2 is formed in a frame as one body.

The first light shielding film LS1 positioned in the display area A/A and the second light shielding film LS2 positioned in the non-display area are spaced apart from each other, thereby preventing static electricity from being transferred to the display area A/A along the light shielding film at the time of a scribing process. Here, the spaced distance (d) between the first light shielding film LS1 and the second light shielding film LS2 is at least 1 μm, 100 μm or more, or preferably 1000 μm or more. The second light shielding film LS2 prevents the transfer of static electricity to the first shielding film LS1. In addition, the second light shielding film LS2 has a predetermined width (w) from a lateral surface of the substrate 105. The width (w) of the second light shielding film LS2 is at least 0.1 μm, 10 μm or more, or preferably 1000 μm or more, and thus provides a width sufficient for a scribing wheel to scribe within the second light shielding film LS2. The width (w) of the second light shielding film LS2 is 10,000 μm or less such that the second light shielding film LS2 cannot reach the display area A/A.

Figure 5:
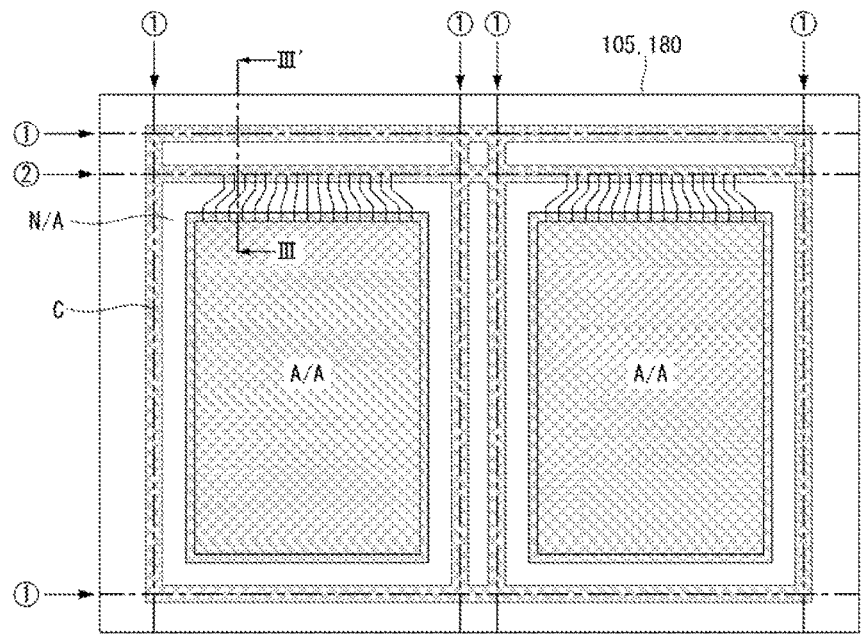
FIG. 5 is a plane view illustrating a scribing process in the display device according to the first embodiment of the present invention.
Figure 6:
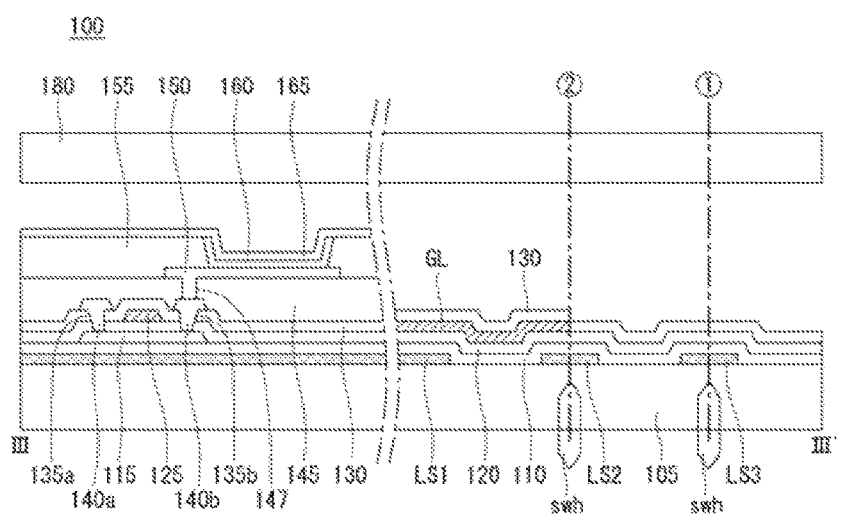
FIG. 6 is a cross-sectional view cut along line III-III' of FIG. 5.

FIG. 5 is a plane view illustrating a scribing process in the display device according to the first embodiment of the present invention; and FIG. 6 is a cross-sectional view cut along line III-III' of FIG. 5.

A scribing process for a display device is performed on large-area substrates on which a plurality cell areas are divided, in order to improve productivity during the manufacturing of the display device. That is, both of a substrate 105 and a counter substrate 80 correspond to large-area substrates. Thus, after a plurality of cells are formed on the large-area substrates, the substrates are bound to each other and then cut by respective cell areas, thereby obtaining a plurality of cells for a display device. Apparatuses for the scribing process are divided into a scribing apparatus which scribes the large-area substrates by cell areas using a scribing wheel to make straight scratches, and a braking apparatus which substantially cuts the large-area substrates to form a plurality of display device cells. Hereinafter, the scribing process using the apparatuses will be described.

Referring to FIGS. 5 and 6, the foregoing substrate 105 provided with thin film transistors and organic light emitting diodes is bound to the counter substrate 180. The bound substrate 105 and counter substrate 180 include a plurality of cell areas C, and each of the plurality of cell areas C is divided into a display area A/A, a non-display area N/A, and a pad area P. A sealing agent such as a sealant is coated on the display area N/A in each of the plurality of cell areas C, so that the substrate 105 and the counter substrate 180 are allowed to bind to each other.

Scribing is conducted using a scribing wheel along the scribing lines of the bound substrates 105 and 180. More specifically, the scribing wheel is arranged on an upper surface of the substrate 105, and then the scribing is performed. Here, the position of the scribing wheel corresponds to the boundary of the cell area C on an external surface of the substrate 105. Particularly, the light shielding films LS2 and LS3 are formed on the boundary of the cell area C to serve as scribing lines. Thus, scribing is conducted using the scribing wheel in a y axis (a vertical direction in the drawing) along scribing line ① of the boundary of the cell area C. Then, scribing is conducted using the scribing wheel in an x axis (a horizontal direction in the drawing) along scribing line ①. Then, scribing is conducted using the scribing wheel in an x axis direction along scribing line ②, thereby performing a scribing process.

Here, the second light shielding film LS2 is positioned on scribing line ①, and the third light shielding film LS3 is positioned on scribing line ②, so that static electricity generated during the scribing process using a scribing wheel is confined in the second light shielding film LS2 and the third light shielding film LS3. However, since the second light shielding film LS2 and the third light shielding film LS3 are spaced apart from the first light shielding film LS1 of the display area A/A, the static electricity confined in the second light shielding film LS2 and the third light shielding film LS3 is not transferred to the first light shielding film LS1. Meanwhile, although not shown, after the substrate 105 is reversed and the scribing wheel is arranged on an upper surface of the counter substrate 180, a process of scribing the counter substrate 180 so as to expose the pad area P of the substrate 105 is additionally performed, thereby manufacturing a final display device.

As such, the display device subjected to the scribing process has the foregoing structure shown in FIGS. 3 and 4. Thus, the display device according to the first embodiment of the present invention includes the first light shielding film and the second light shielding film formed in the display area and the non-display area. Particularly, the first light shielding film and the second light shielding film are spaced apart from each other, and the second light shielding film is disposed at the edge of the substrate to be scribed. Therefore, the static electricity generated at the time of scribing the substrate can be confined in the second light shielding film, and thus the transfer of static electricity to the display area can be prevented.

Figure 7:
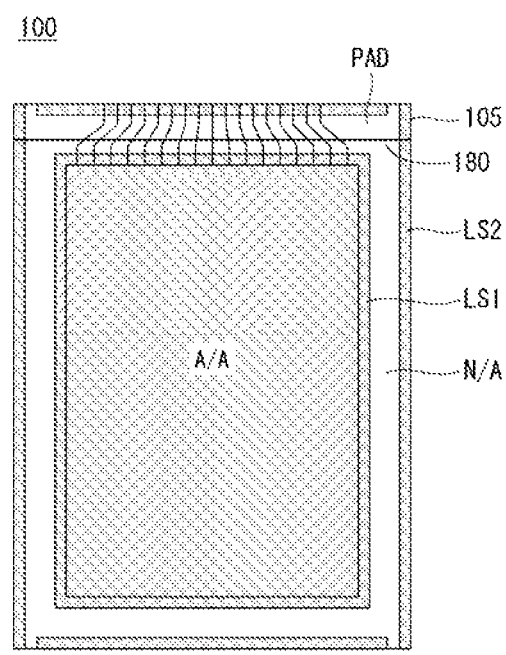
FIG. 7 is a plane view illustrating a display device according to a second embodiment of the present invention.
Figure 8:
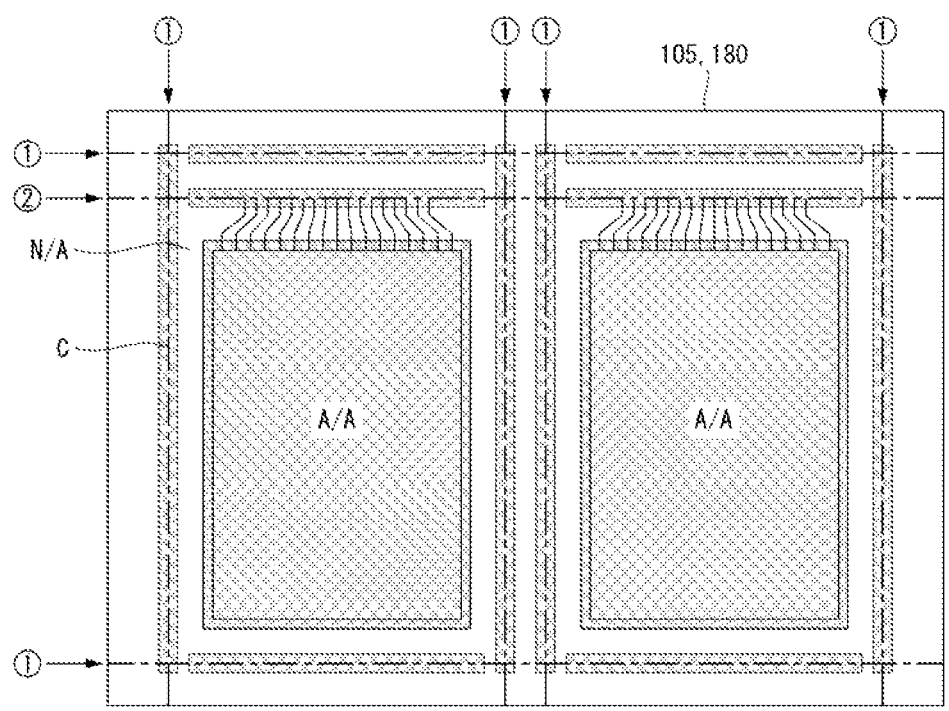
FIG. 8 is a plane view illustrating a scribing process in the display device according to the second embodiment of the present invention.

Meanwhile, FIG. 7 is a plane view illustrating a display device according to a second embodiment of the present invention; and FIG. 8 is a plane view illustrating a scribing process in the display device according to the second embodiment of the present invention. In the following description, the same reference numerals are used to designate the same components as the first embodiment, and thus overlapping descriptions thereof are omitted.

Referring to FIG. 7, a display device 100 set forth in the second embodiment of the present invention is composed of a substrate 105 and a counter substrate 180, which are bound to each other, and includes a display area A/A and a non-display area N/A as the rest area except the display area A/A. In order to apply driving signals to the display area A/A, driving chips are mounted and a pad part PAD including a plurality of lines receiving signals from an external printed circuit board is disposed in the non-display area N/A.

Light shielding films LS1 and LS2 for blocking the entrance of an external light are provided in the display area A/A and the non-display area N/A, respectively. The first shielding film LS1 is positioned in at least the entire region of the display area A/A to block light from entering the thin film transistor formed in the display area A/A. The second shielding film LS2 is positioned to surround the edge of the non-display area N/A to block from static electricity from being transferred to the display area A/A at the time of a scribing process. Here, the first light shielding film LS1 positioned in the display area A/A and the second light shielding film LS2 positioned in the non-display area are spaced apart from each other, thereby preventing static electricity from being transferred to the display area A/A along the light shielding film, at the time of a scribing process.

The first light shielding film LS1 is formed in a plate shape so as to cover the overall display area A/A, and the second light shielding film LS2 is positioned to surround the overall edge of the substrate 105. Unlike the above-described first embodiment, the second light shielding film LS2 is discontinuously formed, for example, in a shape in which lines are spaced apart from each other. For example, as shown in the drawing, the second light shielding film LS2 formed at the upper side of the substrate 105, the second light shielding film LS2 formed at the lower side of the substrate 105, the second light shielding film LS2 formed at the left side of the substrate 105, and the second light shielding film LS2 formed at the right side of the substrate 105 are all disconnected.

A shape in which the second light shielding film LS2 formed at the upper side of the substrate 150 is connected to the second light shielding film LS2 formed at the left side of the substrate 105, but the second light shielding film LS2 formed at the upper side of the substrate 150 is disconnected from the second light shielding film LS2 formed at the right side of the substrate 105 and the second light shielding film LS2 formed at the left side of the substrate 150 is disconnected from the second light shielding film LS2 formed at the lower side of the substrate 105 may be presented. Alternatively, on the contrary to this, a shape in which the second light shielding film LS2 formed at the upper side of the substrate 150 is connected to the second light shielding film LS2 formed at the right side of the substrate 105, but the second light shielding film LS2 formed at the upper side of the substrate 150 is disconnected from the second light shielding film LS2 formed at the left side of the substrate 105 and the second light shielding film LS2 formed at the right side of the substrate 150 is disconnected from the second light shielding film LS2 formed at the lower side of the substrate 105 may be presented.

The above-described display device 100 according to the second embodiment may be scribed as follows. Referring to FIG. 8, the foregoing substrate 105 provided with thin film transistors and organic light emitting diodes is bound to the counter substrate 180. The bound substrate 105 and counter substrate 180 include a plurality of cell areas C, and each of the plurality of cell areas C is divided into a display area A/A, a non-display area N/A, and a pad area P. A sealing agent such as a sealant is coated on the display area N/A in each of the plurality of cell areas C, and thus the substrate 105 and the counter substrate 180 are allowed to bind to each other.

Scribing is conducted using a scribing wheel along the scribing lines of the bound substrates 105 and 180. More specifically, the scribing wheel is arranged on an upper surface of the substrate 105, and then the scribing is performed. Here, the position of the scribing wheel corresponds to the boundary of the cell area C on an external surface of the substrate 105. Particularly, the light shielding films LS2 and LS3 are formed on the boundary of the cell area to serve as scribing lines. Here, the light shielding films LS2 and LS3 may be formed in a shape in which lines are spaced apart from each other. For example, as shown in FIG. 8, the second light shielding film LS2 formed at the upper side of the substrate 105 and the third light shielding film LS3, the second light shielding film LS2 formed at the lower side of the substrate 105 and the third light shielding film LS3, and the second light shielding film LS2 formed at the left side of the substrate 105 and the third light shielding film LS3, and the second light shielding film LS2 formed at the right side of the substrate 105 and the third light shielding film LS3 are all disconnected from each other.

Scribing is conducted using the scribing wheel in a y axis (a vertical direction in the drawing) along scribing line ①  of the boundary of the cell area C. Then, scribing is conducted using the scribing wheel in an x axis (a horizontal direction in the drawing) along scribing line ①. Then, scribing is conducted using the scribing wheel in an x axis direction along scribing line ②, thereby performing a scribing process.

Here, the second light shielding film LS2 and the third light shielding film LS3 are positioned on scribing line ①, and the second light shielding film LS2 is positioned on scribing line ②, so that static electricity generated during the scribing process using a scribing wheel is confined in the second light shielding film LS2 and the third light shielding film LS3. However, since the second light shielding film LS2 and the third light shielding film LS3 are spaced apart from the first light shielding film LS1 of the display area A/A, the static electricity confined in the second light shielding film LS2 and the third light shielding film LS3 is not transferred to the first light shielding film LS1.

As described above, the display device according to the second embodiment of the present invention includes the first light shielding film and the second light shielding film formed in the display area and the non-display area. Particularly, the first light shielding film and the second light shielding film are spaced apart from each other, and the second light shielding film is disposed at the edge of the substrate to be scribed. Therefore, the static electricity generated at the time of scribing the substrate can be confined in the second light shielding film, and thus the transfer of static electricity to the display area can be prevented.

Figure 9:
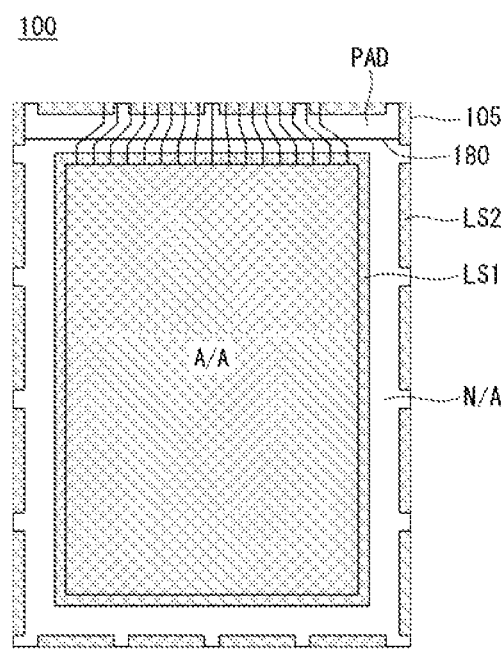
FIG. 9 is a plane view illustrating a display device according to a third embodiment of the present invention.
Figure 10:
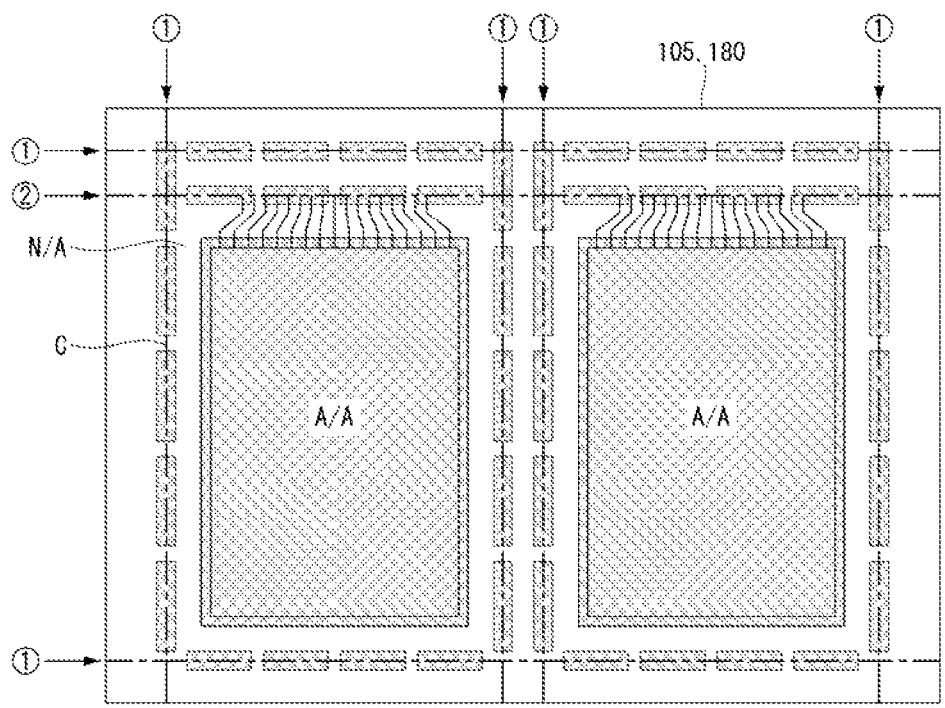
FIG. 10 is a plane view illustrating a scribing process in the display device according to the third embodiment of the present invention.

Meanwhile, FIG. 9 is a plane view illustrating a display device according to a third embodiment of the present invention; and FIG. 10 is a plane view illustrating a scribing process in the display device according to the third embodiment of the present invention. In the following description, the same reference numerals are used to designate the same components as the first and embodiments, and thus overlapping descriptions thereof are omitted.

Referring to FIG. 9, a display device 100 set forth in the third embodiment of the present invention includes of a substrate 105 and a counter substrate 180, which are bound to each other, and includes a display area A/A and a non-display area N/A as the rest area except the display area A/A. In order to apply driving signals to the display area A/A, driving chips are mounted and a pad part PAD including a plurality of lines receiving signals from an external printed circuit board is disposed in the non-display area N/A.

Light shielding films LS1 and LS2 for blocking the entrance of an external light are provided in the display area A/A and the non-display area N/A, respectively. The first shielding film LS1 is positioned in at least the entire region of the display area A/A to block light from entering the thin film transistor formed in the display area A/A. The second shielding film LS2 is positioned to surround the edge of the non-display area N/A to block from static electricity from being transferred to the display area A/A at the time of a scribing process. Here, the first light shielding film LS1 positioned in the display area A/A and the second light shielding film LS2 positioned in the non-display area are spaced apart from each other, thereby preventing static electricity from being transferred to the display area A/A along the light shielding film, at the time of a scribing process.

The first light shielding film LS1 is formed in a plate shape so as to cover the overall display area A/A, and the second light shielding film LS2 is positioned to surround the overall edge of the substrate 105. Unlike the above-described first embodiment, the second light shielding film LS2 is discontinuously formed, for example, in a dot shape. For example, as shown in the drawing, the second light shielding film LS2 formed at each of the upper and lower sides of the substrate 105 is formed in a shape of four separate dots, and the second light shielding film LS2 formed at each of the left and right sides of the substrate 105 is formed in a shape of five separate dots. However, the present invention is not limited thereto, and thus, two to several tens of dots may be formed depending on the positions of the second light shielding film LS2. The spaced distance between the dots of the second light shielding film LS2 is at least 1 µm, 100 µm or more, or preferably 1000 µm or more. The second light shielding film LS2 prevents the transfer of static electricity.

The above-described display device 100 according to the third embodiment may be scribed as followed. Referring to FIG. 10, the foregoing substrate 105 provided with thin film transistors and organic light emitting diodes is bound to the counter substrate 180. The bound substrate 105 and counter substrate 180 include a plurality of cell areas C, and each of the plurality of cell areas C is divided into a display area A/A, a non-display area N/A, and a pad area P. A sealing agent such as a sealant is coated on the display area N/A in each of the plurality of cell areas C, and thus the substrate 105 and the counter substrate 180 are allowed to bind to each other.

Scribing is conducted using a scribing wheel along the scribing lines of the bound substrates 105 and 180. More specifically, the scribing wheel is arranged on an upper surface of the substrate 105, and then scribing is conducted. Here, the position of the scribing wheel corresponds to the boundary of the cell area C on an external surface of the substrate 105. Particularly, the light shielding films LS2 and LS3 are formed on the boundary of the cell area C to serve as scribing lines. Here, the light shielding films LS2 and LS3 may be formed in a dot shape. For example, as shown in FIG. 10, the second light shielding film LS2 formed at each of the upper and lower sides of the substrate 105 is formed in a shape of four dots, and the second light shielding film LS2 formed at each of the left and right sides of the substrate 105 is formed in a shape of five dots.

Scribing is conducted using the scribing wheel in a y axis (a vertical direction in the drawing) along scribing line ① of the boundary of the cell area C. Then, scribing is conducted using the scribing wheel in an x axis (a horizontal direction in the drawing) along scribing line ①. Then, scribing is conducted using the scribing wheel in an x axis direction along scribing line ②, thereby performing a scribing process.

Here, the second light shielding film LS2 and the third light shielding film LS3 are positioned on scribing line ①, and the second light shielding film LS3 is positioned on scribing line ②, so that static electricity generated during the scribing process using a scribing wheel is confined in the second light shielding film LS2 and the third light shielding film LS3. However, since the second light shielding film LS2 and the third light shielding film LS3 are spaced apart from the first light shielding film LS1 of the display area A/A, the static electricity confined in the second light shielding film LS2 and the third light shielding film LS3 is not transferred to the first light shielding film LS1.

As described above, the display device according to the third embodiment of the present invention includes the first light shielding film and the second light shielding film formed in the display area and the non-display area. Particularly, the first light shielding film and the second light shielding film are spaced apart from each other, and the second light shielding film is disposed at the edge of the substrate to be scribed. Therefore, the static electricity generated at the time of scribing the substrate can be confined in the second light shielding film, and thus the transfer of static electricity to the display area can be prevented.

Figure 1:
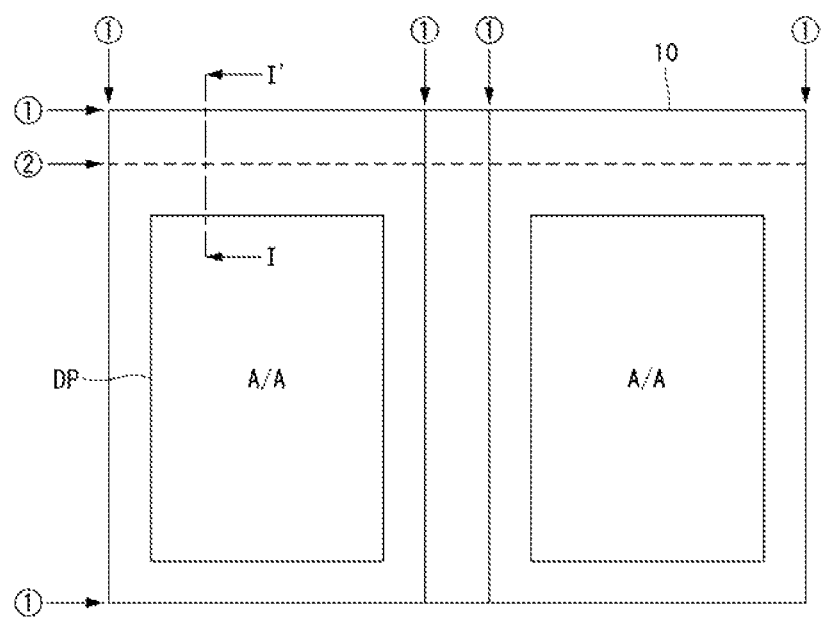
FIG. 1 is a plane view of a display device according to a related art.
Figure 2:
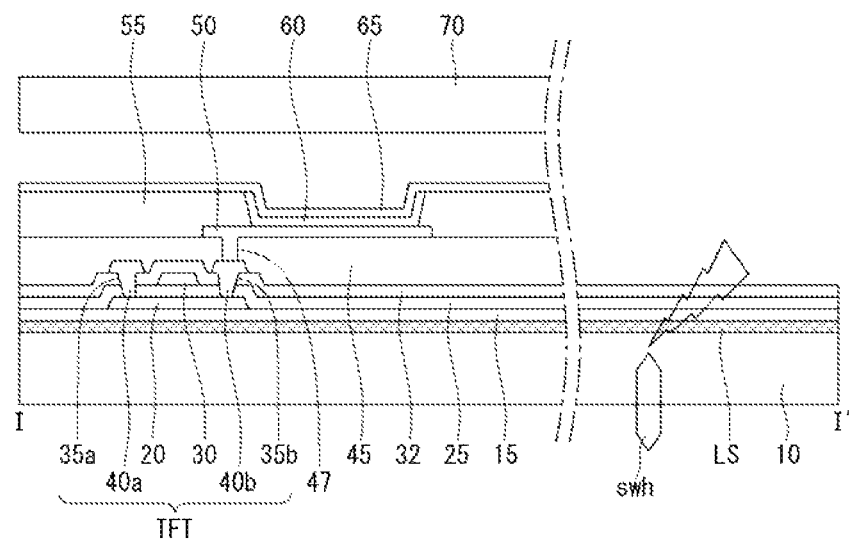
FIG. 2 is a cross-sectional view cut along line I-I' of FIG. 1.
Figure 11:
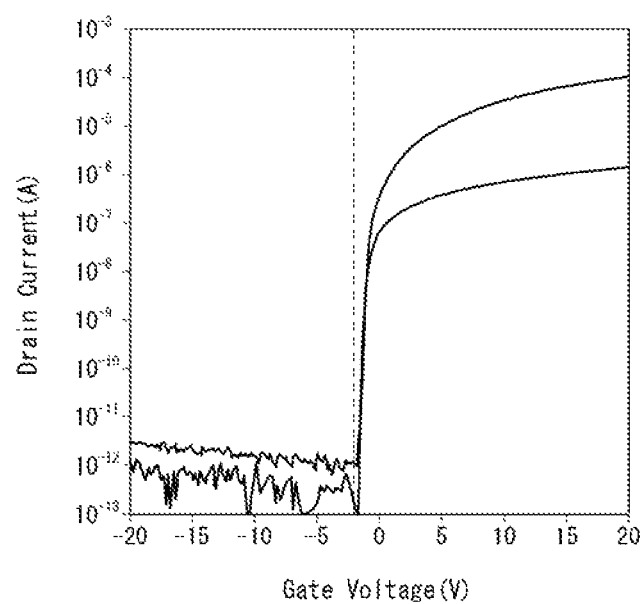
FIG. 11 is a graph illustrating a gate voltage-drain current curve in a thin film transistor of the display device manufactured according to the first embodiment of the present invention.
Figure 12:
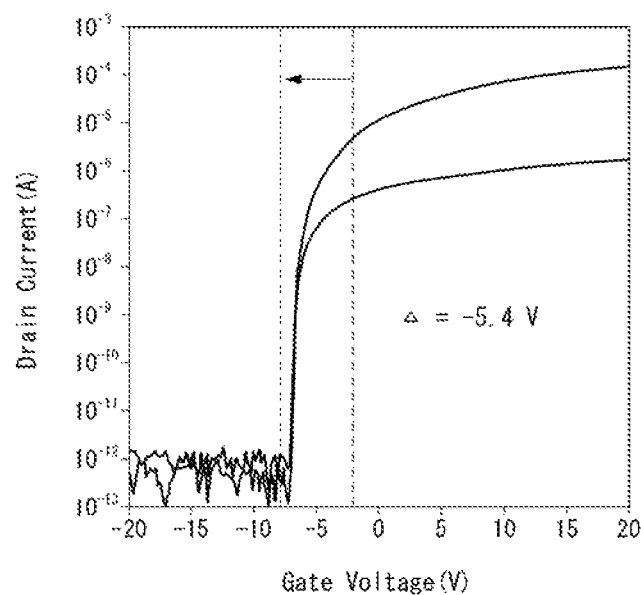
FIG. 12 is a graph illustrating a gate voltage-drain current curve in a thin film transistor of a display device manufactured according to the related art.

FIG. 11 is a graph illustrating a gate voltage-drain current curve in a thin film transistor of the display device manufactured according to the first embodiment of the present invention; and FIG. 12 is a graph illustrating a gate voltage-drain current curve in a thin film transistor of a display device manufactured according to the related art. Here, the display device manufactured according to the related art is the display shown in FIG. 2.

Referring to FIG. 11, a thin film transistor of a display device, which was manufactured by scribing the substrate having the light shielding films formed on the scribing lines according to the first embodiment of the present invention, shows a threshold voltage of −2 V. In contrast, referring to FIG. 12, a thin film transistor of a display device, which was manufactured by scribing the substrate according to the related art, shows a threshold voltage of −7.6 V, which is shifted by about −5.4 V when compared with the thin film transistor according to the present invention. That is, according to the present invention, the light shielding film formed on the scribing line of the substrate is spaced apart from the light shielding film of the display area, thereby preventing the deterioration in the thin film transistor due to static electricity generated during the scribing process.

The display devices according to the embodiments of the present invention include the first light shielding film and the second light shielding film formed in the display area and the non-display area while the first light shielding film and the second light film are spaced apart from each other, thereby preventing the static electricity generated during the scribing process from being transferred to the display area and thus improving reliability of the display device.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
   a substrate divided into a display area and a non-display area surrounding the display area, wherein the display area includes a thin film transistor (TFT) including an active layer, a gate electrode, and source and drain electrodes;
   a first light shielding film formed in the display area, the first light shielding film being disposed under the active layer of the TFT throughout the display area; and
   a second light shielding film formed in the non-display area,
   wherein the second light shielding film is positioned in a partial region of the non-display area to surround an edge of the non-display area such that the first and second light shielding films are spaced apart from each other in the non-display area.

2. The display device of claim 1, wherein the first light shielding film is formed in an entire region of the display area and is further formed in an edge region of the non-display area.

3. The display device of claim 1, wherein the second light shielding film surrounds an edge of the substrate.

4. The display device of claim 3, wherein the second light shielding film is continuously or discontinuously formed.

5. The display device of claim 1, wherein the spaced distance between the first light shielding film and the second light shielding film is 1 μm to 10,000 μm.

6. The display device of claim 1, wherein a width of the second shielding film is 1 μm to 10,000 μm.

7. A display device, comprising:
   a substrate including a display area and a non-display area surrounding the display area, wherein the display area includes a thin film transistor (TFT) including an active layer formed of an oxide thin film;
   a first light shielding film disposed under the active layer of the TFT throughout the display area; and
   a second light shielding film disposed in a partial region of the non-display area to surround an edge of the non-display area such that the first and second light shielding films are spaced apart from each other in the non-display area.

8. The display device of claim 7, wherein the first light shielding film and the second light shielding film are spaced apart from each other along a scribing line in the non-display area.

9. The display device of claim 7, wherein the first light shielding film is formed in an entire region of the display area and is further formed in an edge region of the non-display area.

10. The display device of claim 7, wherein the second light shielding film surrounds an edge of the substrate.

11. A method for forming a display device, the method comprising:
   providing a substrate including a display area and a non-display area surrounding the display area;
   forming a first light shielding film in the display area and a second light shielding film in the non-display area, respectively; and
   forming a plurality of thin film transistors (TFTs) on the first light shielding film, each TFT including an active layer,
   wherein the first light shielding film is formed throughout the display area to prevent light from entering the active layer of the TFT, and
   wherein the second light shielding film is formed in a partial region of the non-display area to surround an edge of the non-display area such that the first and second light shielding films are spaced apart from each other in the non-display area.

12. The method of claim 11, wherein the forming the plurality of TFTs includes forming an oxide thin film on the substrate to provide the active layer of the TFT.

13. The method of claim 11, wherein the first and second light shielding films are formed to be spaced apart from each other along a scribing line in the non-display area.

14. The method of claim 11, wherein the forming the first light shielding film includes forming the first light shielding film in an entire region of the display area and in an edge region of the non-display area.

15. The method of claim 11, wherein the forming the second light shielding film includes forming the second light shielding film along an edge of the substrate.

* * * * *